United States Patent [19]

Mikoshiba et al.

[11] Patent Number: 4,511,816

[45] Date of Patent: Apr. 16, 1985

[54] SURFACE ACOUSTIC WAVE DEVICE USING AN ELASTIC SUBSTRATE AND AN ALUMINUM NITRIDE PIEZOELECTRIC FILM

[75] Inventors: Nobuo Mikoshiba; Kazuo Tsubouchi; Kazuyoshi Sugai, all of Sendai, Japan

[73] Assignees: Nobuo Mikoshiba; Kazuo Tsubouchi, both of Sendai, Japan

[21] Appl. No.: 473,410

[22] Filed: Mar. 9, 1983

[30] Foreign Application Priority Data

Mar. 11, 1982 [JP] Japan .................................. 57-39238
Mar. 11, 1982 [JP] Japan .................................. 57-39239
Mar. 11, 1982 [JP] Japan .................................. 57-39240

[51] Int. Cl.³ ............................................ H03H 9/44
[52] U.S. Cl. ........................... 310/313 A; 310/313 B; 333/155
[58] Field of Search ........... 310/313 A, 313 B, 313 D, 310/313 R, 312; 333/150, 152, 153, 193, 195, 196, 155

[56] References Cited

U.S. PATENT DOCUMENTS 3,965,444 6/1976 Willingham et al. ................ 333/155
4,037,176 7/1977 Ono et al. ............................ 333/155
4,354,130 10/1982 Ono et al. ............................ 333/154

FOREIGN PATENT DOCUMENTS 150831 5/1978 Japan .
1363519 8/1974 United Kingdom ................ 333/150

OTHER PUBLICATIONS

Tsubouchi, et al., "High-Frequency and Low-Dispersion SAW Devices on AlN/Al₂O₃ and AlNSi for Signal Processing", Ultrasonics Symposium Proc., 1980, p. 446.

Primary Examiner—William H. Beha, Jr.
Assistant Examiner—D. L. Rebsch
Attorney, Agent, or Firm—Flynn, Thiel, Boutell & Tanis

[57] ABSTRACT

A surface acoustic wave device comprises an elastic substrate having a major surface with a given crystal orientation and having a positive temperature coefficient of delay (TCD), and AlN film deposited on the elastic substrate so that piezoelectric axis of the AlN film has a predetermined direction with respect to the major surface of the elastic substrate having a negative TCD, and electrodes provided on the AlN film or between the elastic substrate and the AlN film.

45 Claims, 37 Drawing Figures

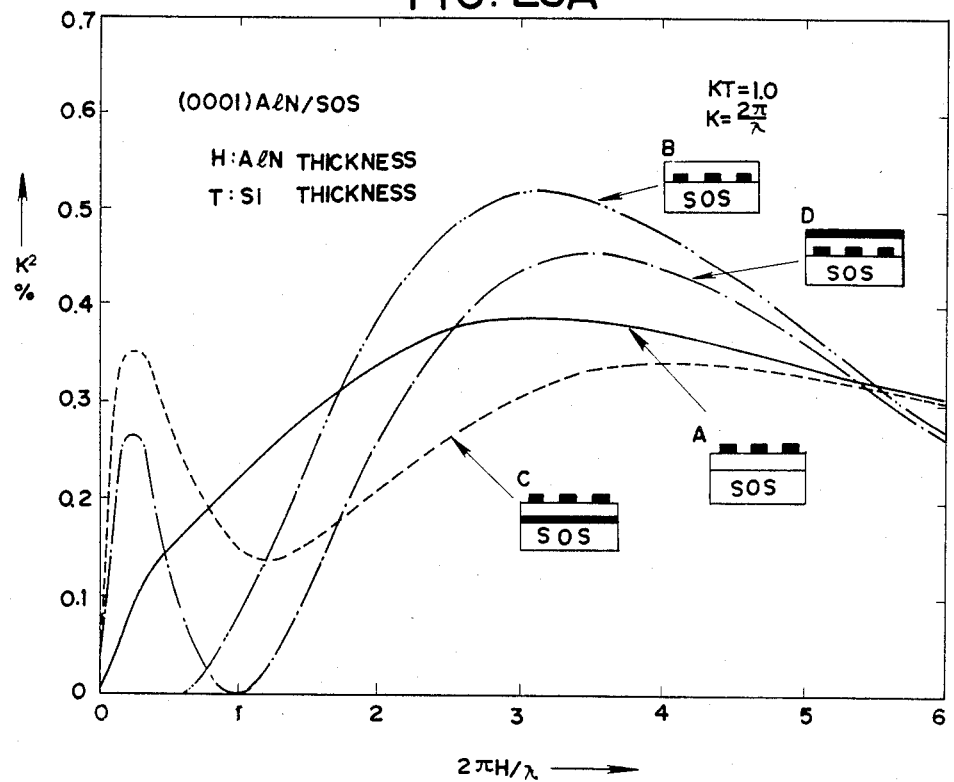

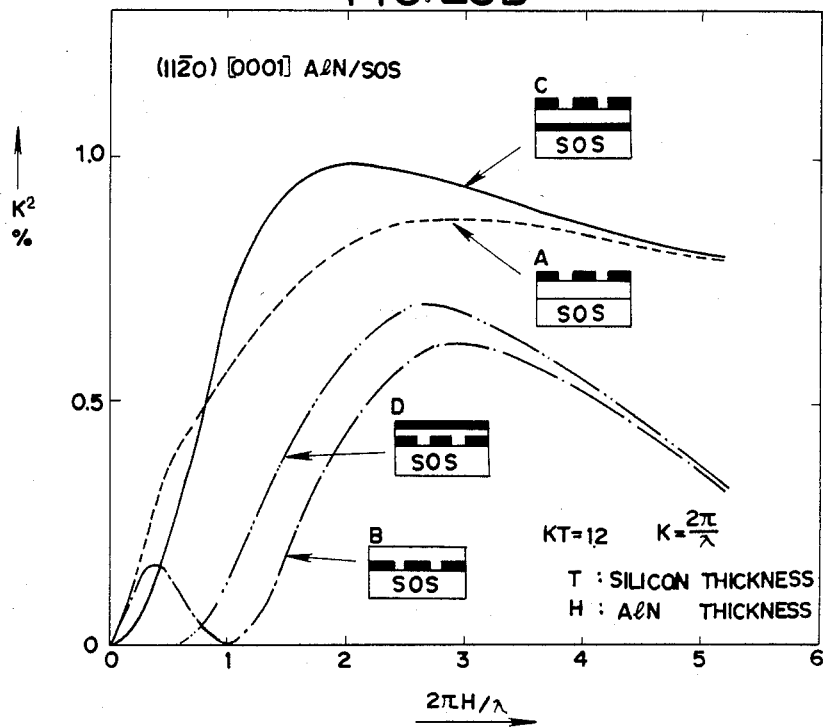

SURFACE ACOUSTIC WAVE DEVICE USING AN ELASTIC SUBSTRATE AND AN ALUMINUM NITRIDE PIEZOELECTRIC FILM

BACKGROUND OF THE INVENTION

This invention relates to a surface acoustic wave device with a novel structure that yields excellent performance.

As structures of surface acoustic wave devices (substrates) to deal with various electrical signals there are conventionally known the following:

1. a single structure consisting of only a piezoelectric substrate (piezoelectric single-crystal substrate, piezoelectric ceramic substrate, etc.);
2. a laminated structure with a piezoelectric film being deposited on a non-piezoelectric substrate;
3. a laminated structure with a piezoelectric film being deposited on a semiconductive substrate; and others.

A known format of the laminated structure of No. 2 in the above comprises a sapphire substrate or a glass substrate with a zinc oxide film (ZnO) deposited thereon by sputtering. However, zinc oxide film has the following drawbacks:

1. it is difficult to obtain good quality of film, thereby causing fabrication of devices inferior in piezoelectricity, etc.;
2. propagation loss of surface acoustic wave is large in the high frequency range;
3. dispersion propagation characteristics of a surface acoustic wave is large; and
4. it is difficult to control variation ratio $(1/\tau)\cdot(\partial\tau/\partial T)$ of delay time $(\tau)$ of surface acoustic wave depending on variation of temperature (T is ambient temperature).

OBJECT OF THE INVENTION

It is therefore an object of the present invention to overcome those problems involved in the prior art and to provide a surface acoustic wave device which is excellent in its properties, facilitates its fabrication, and costs less.

SUMMARY OF THE INVENTION

The fundamental feature of the present invention to attain the objective is the use of an elastic substrate which is positive in its delay time temperature coefficient with respect to surface acoustic waves and has AlN (aluminum nitride) film provided on the substrate. Use of sapphire substrate, SOS substrate or silicon single-crystal substrate as said elastic substrate is especially effective to realize the objective.

BRIEF DESCRIPTION OF THE DRAWINGS

FIGS. 22A, 22B, 23A, 23B, 24A and 24B show characteristics obtained by the embodiments of FIGS. 18 to 21.

DETAILED DESCRIPTION OF THE PREFERRED EMBODIMENTS

Figure 1:
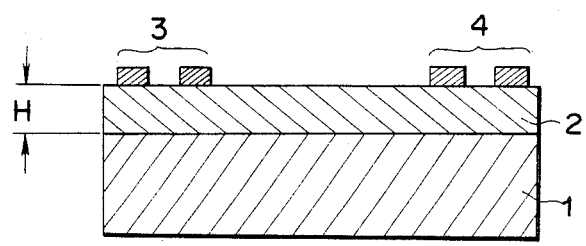
FIG. 1 is a sectional view illustrating an embodiment according to the present invention.

The present invention will now be described in detail by way of preferred embodiments referring to the drawings.

FIG. 1 is a sectional view of an embodiment of the surface acoustic wave device according to the present invention. Reference numeral 1 designates a sapphire substrate which is cut by an equivalent surface (C-surface) to the (0001)-crystal-surface. Reference numeral 2 denotes an AlN film which is deposited on the sapphire substrate 1 so that the piezoelectric axis (C-axis or [0001]-axis) of the film is perpendicular or parallel to the surface of the sapphire substrate 1. Reference numerals 3 and 4 refer to comb-shaped electrodes for generating surface acoustic waves and comb-shaped electrodes for detecting surface acoustic waves, respectively, and reference symbol H refers to thickness of the AlN film 2.

A first example will be described hereunder wherein the sapphire substrate 1 is cut by the equivalent surface (C-surface) to the (0001)-crystal-surface, and the AlN film 2 is deposited so that the C-axis thereof is perpendicular to the surface of the sapphire substrate 1. Surface acoustic waves are made to propagate in a direction perpendicular to the piezoelectric axis (C-axis) of the AlN film 2 and in the direction equivalent to the [1$\bar{1}$00]-axis (Y-axis) on the (0001)-surface of the sapphire substrate 1.

Figure 2:
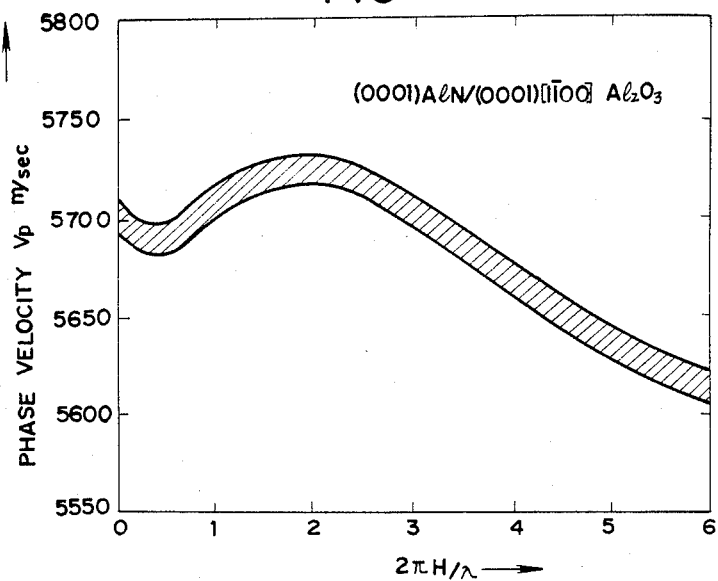
FIGS. 2 to 10 show characteristics obtained by the device of FIG. 1.

FIG. 2 shows a velocity dispersion characteristic to surface acoustic waves which is obtained by the first example. In this Figure, the abscissa is normalized thickness $2\pi H/\lambda$ ($\lambda$ is the wavelength of a surface acoustic wave) when the thickness of the AlN film 2 is H, while the ordinate is phase velocity $V_p$ of surface acoustic waves. The phase velocity does not disperse much, but is very large.

Figure 3:
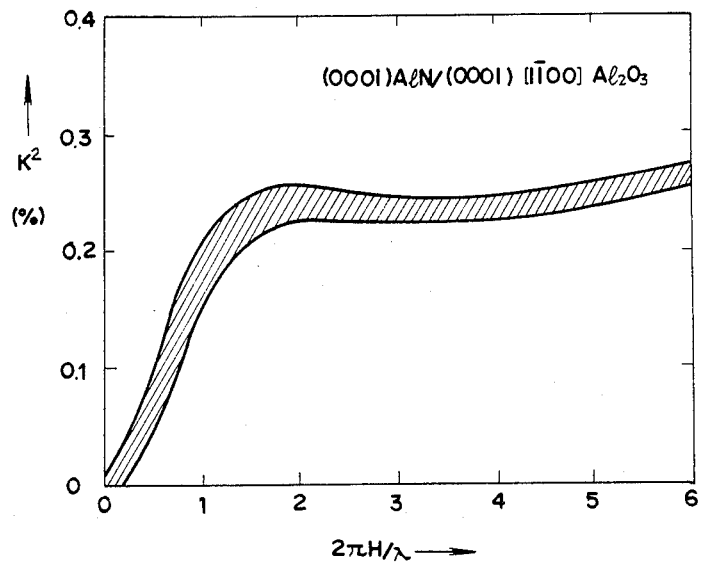

FIG. 3 shows a characteristic curve of electromechanical coupling coefficient which is obtained by the first example. The abscissa is the normalized thickness $2\pi H/\lambda$, while the ordinate is electromechanical coupling coefficient $K^2$. When the normalized thickness $2\pi H/\lambda$ is 2.0 to 6.0, $K^2$ is 0.22% to 0.27%. This value is in general suitable for generation and detection of surface acoustic waves, and yields excellent piezoelectricity.

Figure 4:
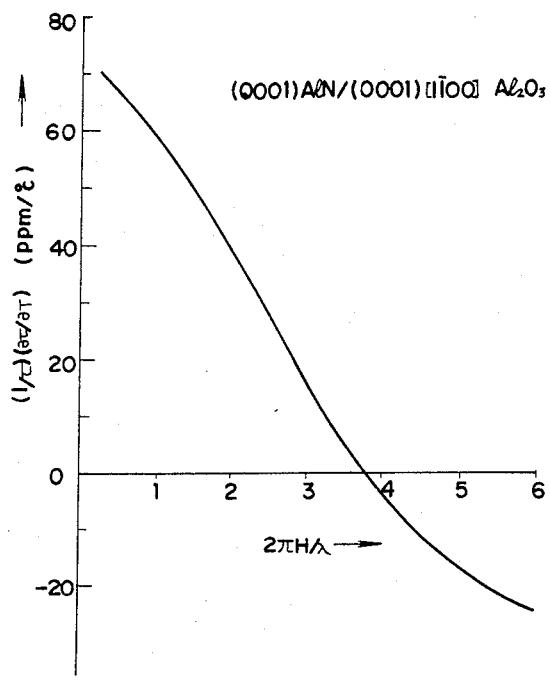

FIG. 4 shows a characteristic curve of temperature coefficient of delay (TCD) of surface acoustic waves which is obtained by the first example. The abscissa is the normalized thickness $2\pi H/\lambda$ while the ordinate shows temperature variation ratio $(1/\tau)\cdot(\partial\tau/\partial T)$ of delay time $\tau$ in ppm/°C. units. Since the delay time temperature coefficient of the sapphire substrate 1 is positive while that of the AlN film 2 is negative, these temperature coefficients compensate each other, and the resulting characteristic varies in accordance with the thickness H of the AlN film 2. When the thickness H is in the range to satisfy the relation $3.0 < 2\pi H/\lambda < 5.0$, delay time temperature variation ratio approaches zero.

The first example, therefore, realizes a surface acoustic wave device which has an excellent delay time temperature variation characteristic, as well as velocity dispersion characteristic and $K^2$ characteristic.

A second example will be described hereunder. The second example is different from the first example merely in that surface acoustic wave is made to propagate in the direction equivalent to the [1120]-axis (X-axis) on the (0001)-surface of the sapphire substrate instead of the direction equivalent to [1100]-axis (Y-axis).

Figure 5:
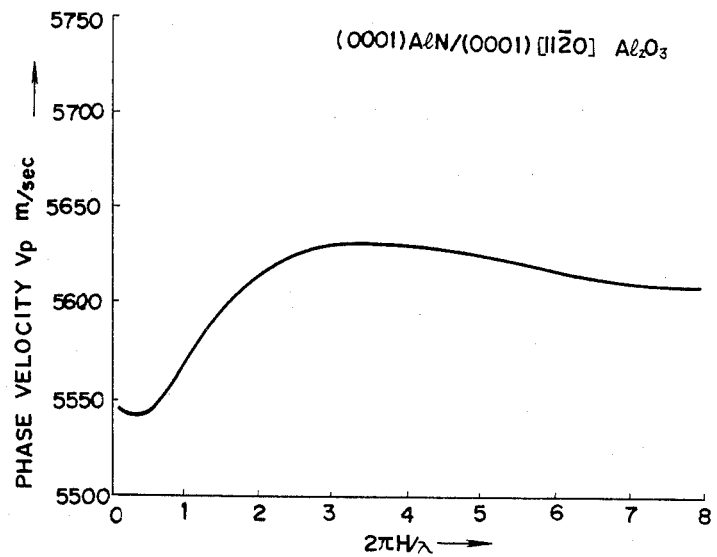

FIG. 5 shows a velocity dispersion characteristic to surface acoustic wave which is obtained by the second example. Phase velocity $V_p$ does not disperse so much but is very large.

Figure 6:
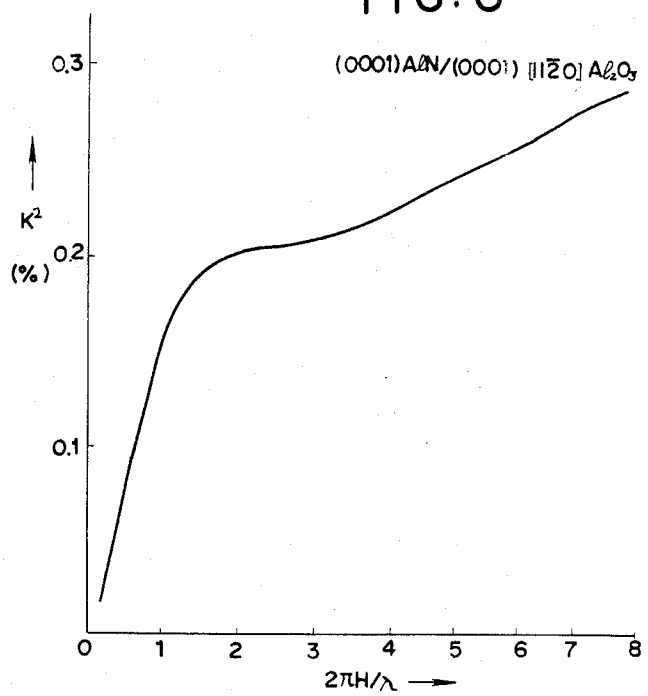

FIG. 6 shows a characteristic curve of electromechanical coupling coefficient ($K^2$ characteristic) which is obtained by the second example. When the normalized thickness is 2.0 to 8.0, $K^2$ is 0.2% to 0.28%. This value is in general suitable for generation and detection of surface acoustic wave, and leads to excellent piezoelectrcity.

Figure 7:
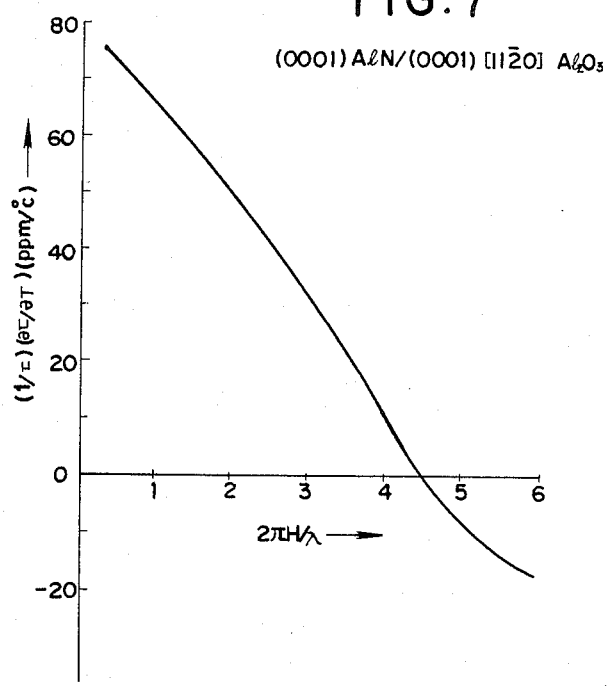

FIG. 7 shows a characteristic curve of delay time temperature coefficient (TCD) of surface acoustic wave which is obtained by the second example. When the thickness H of the AlN film 2 is in the range to satisfy the relation $3.0 < 2\pi H/\lambda < 6.0$, delay time temperature variation ratio approaches zero.

The second example, therefore, also realizes a surface acoustic wave device which is excellent in delay time temperature variation characteristic as well as velocity dispersion characteristic and $K^2$ characteristic.

A third example will be described hereunder wherein the sapphire substrate 1 is cut by R-surface equivalent to the (0112)-crystal-surface, and the AlN film 2 is deposited so that the C-axis thereof is parallel to the [0111]-axis of the sapphire substrate 1. Surface acoustic wave is made to propagate in the parallel direction to the piezoelectric axis (C-axis) of the AlN film 2 and in the direction equivalent to [0111]-axis on the (0112)-surface (R-surface) of the sapphire substrate 1.

Figure 8:
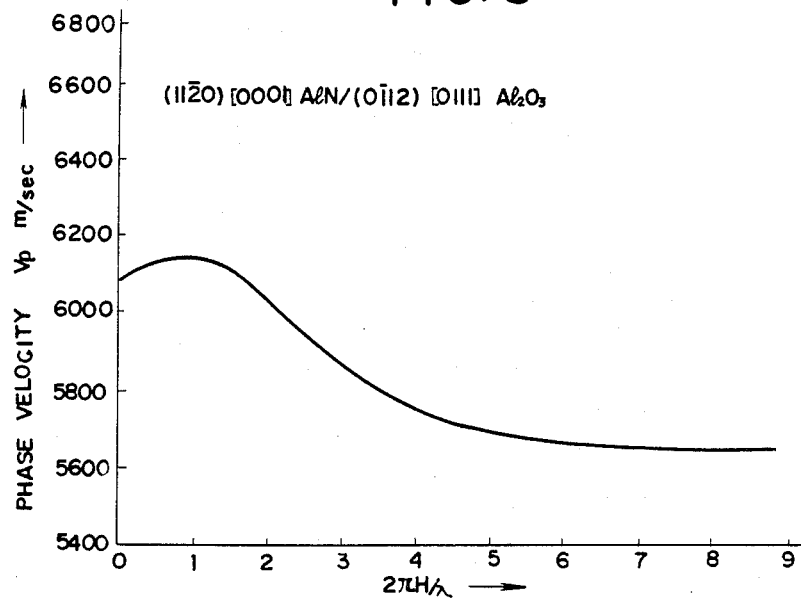

FIG. 8 shows a velocity dispersion characteristic of surface acoustic wave which is obtained by the third example. Phase velocity $V_p$ does not disperse so much but is very large.

Figure 9:
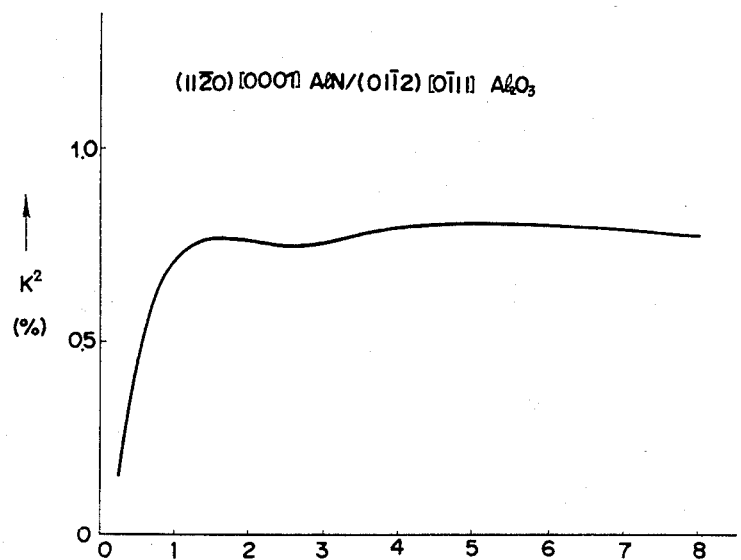

FIG. 9 shows a characteristic curve of electromechanical coupling coefficient which is obtained by the third example. When the normalized thickness $2\pi H/\lambda$ is 1.0 to 8.0, $K^2$ is 0.75% to 0.8%. This value is in general suitable for generation and detection of surface acoustic wave, and leads to excellent piezoelectricity.

Figure 10:
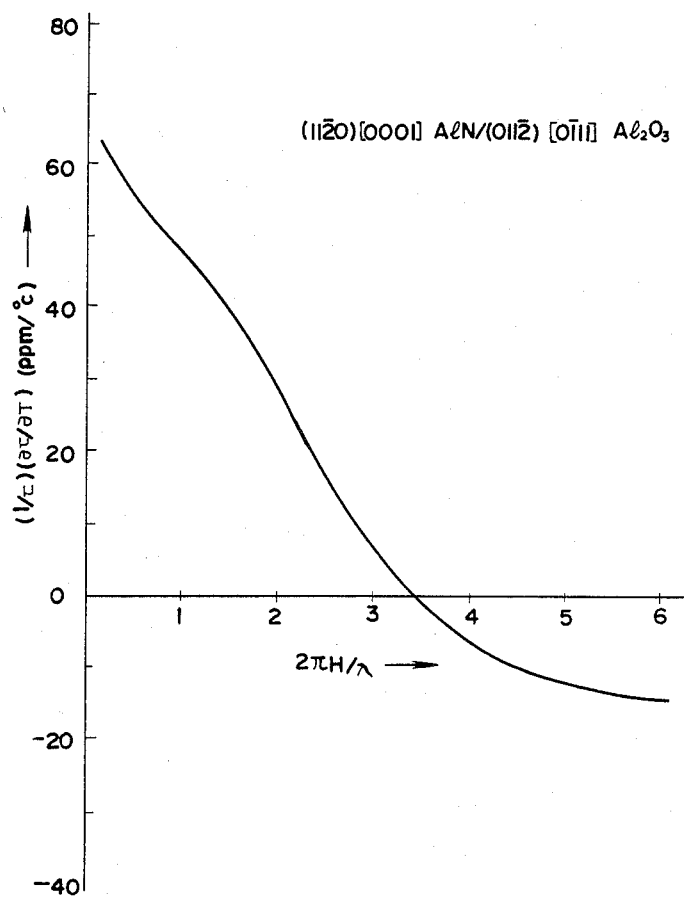

FIG. 10 shows a characteristic curve of delay time temperature coefficient (TCD) of surface acoustic wave which is obtained by the third example. When the thickness H of the AlN film 2 is in the range to satisfy the relation $2.0 < 2\pi H/\lambda < 5.0$, delay time temperature variation ratio approaches zero.

The third example, therefore, also realizes a surface acoustic wave device which is excellent in delay time temperature variation characteristic as well as velocity dispersion characteristic and $K^2$ characteristic.

FIGS. 11 to 14 show further embodiments of the present invention wherein a silicon single-crystal substrate having a positive delay time temperature coefficient to surface acoustic wave is used as the elastic substrate.

Figure 11:
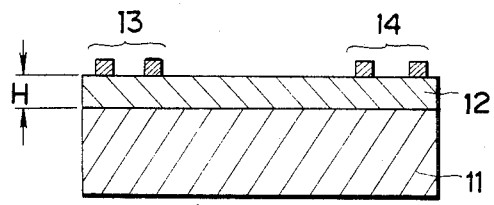
FIGS. 11 to 14 are sectional views illustrating further embodiments according to the present invention.

In the embodiment of FIG. 11, reference numeral 11 designates a silicon single-crystal substrate which is cut by a surface equivalent to (111)-crystal-surface, (110)-crystal-surface or (001)-crystal-surface. Reference numeral 12 denotes an AlN film which is deposited on the silicon single-crystal substrate 11 so that the piezoelectric axis (C-axis or [0001]-axis) of the film is perpendicular or parallel to the silicon single-crystal substrate 11. Reference numerals 13 and 14 are comb-shaped electrodes for generating surface acoustic wave and comb-shaped electrodes for detecting surface acoustic wave, respectively. Reference symbol H is thickness of the AlN film 12.

Figure 13:
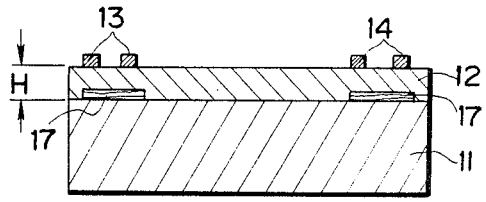
Figure 14:
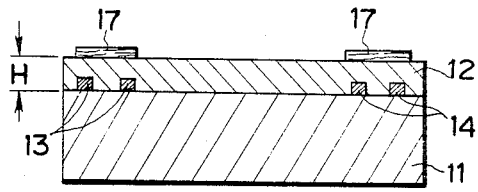
Figure 15A:
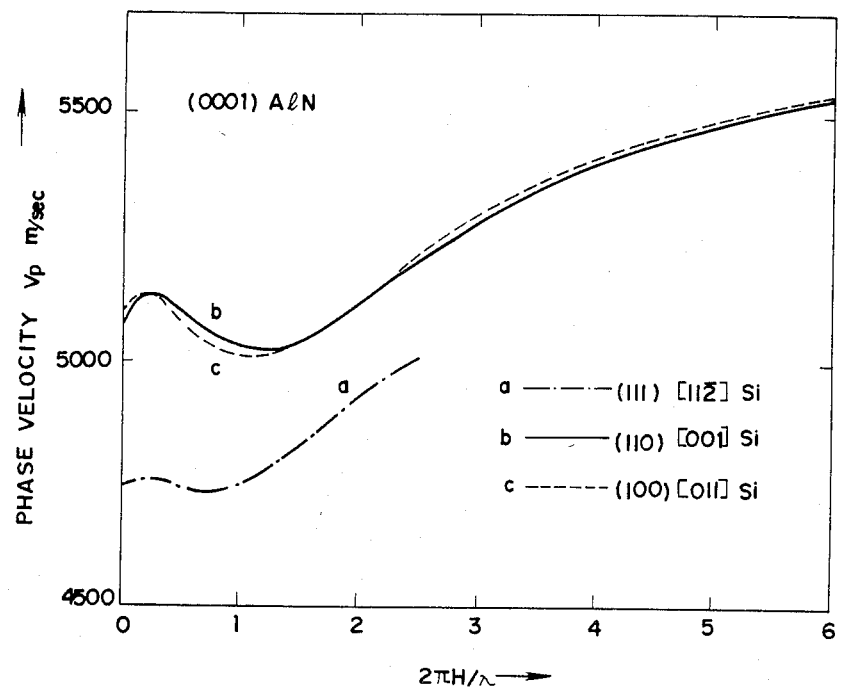
FIGS. 15A, 15B, 16A to 16D and 17A to 17F show characteristics obtained by the embodiments of FIGS. 11 to 14.

FIG. 15A shows velocity dispersion characteristics which are obtained when the devices of FIGS. 11 to 14 are used and surface acoustic wave propagates in the perpendicular direction to the piezoelectric axis (C-axis or [0001]-axis) of the AlN film 12. In FIG. 11, the abscissa is normalized thickness $2\pi H/\lambda$ while the ordinate is phase velocity $V_p$ of surface acoustic wave. Curve (a) is obtained when surface acoustic wave propagates in the direction equivalent to the [112]-axis on the (111)-surface of the silicon single-crystal substrate 11, curve (b) is obtained when surface acoustic wave propagates in the direction equivalent to the [0011]-axis on the (110)-surface of the silicon single-crystal substrate 11, and curve (c) is obtained when surface acoustic wave propagates in the direction equivalent to the [011]-axis on the (100)-surface of the silicon single-crystal substrate 11. As apparent from the Figure, the phase velocity $V_p$ does not disperse so much but is very large.

Figure 16A:
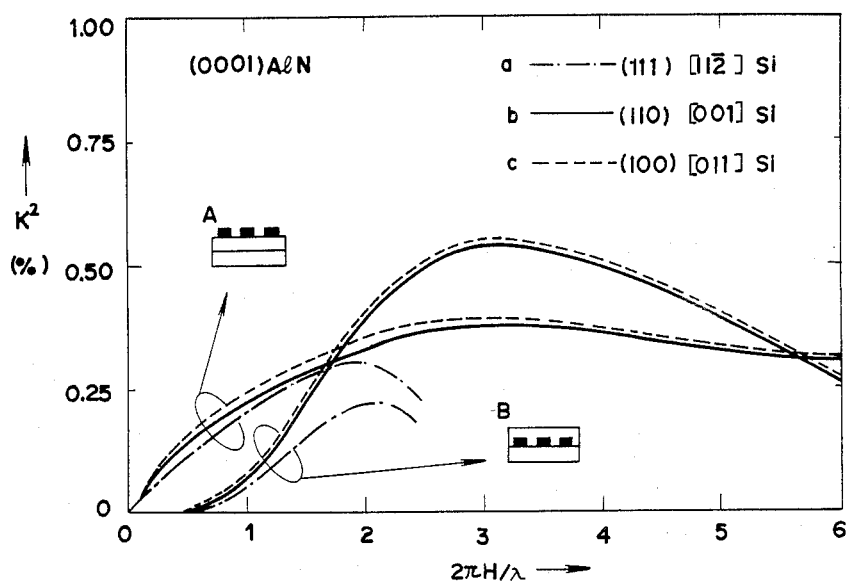

FIG. 16A shows characteristic curves of electromechanical coupling coefficients which are obtained by the same embodiments. the abscissa is the normalized thickness $2\pi H/\lambda$ while the ordinate is electromechanical coupling coefficient $K^2$. In this Figure, device A has the structure of FIG. 11. These curves show that electromechanical coupling coefficients $K^2$ suitable for generating and detection of surface acoustic wave and excellent piezoelectricities can be obtained.

Figure 17A:
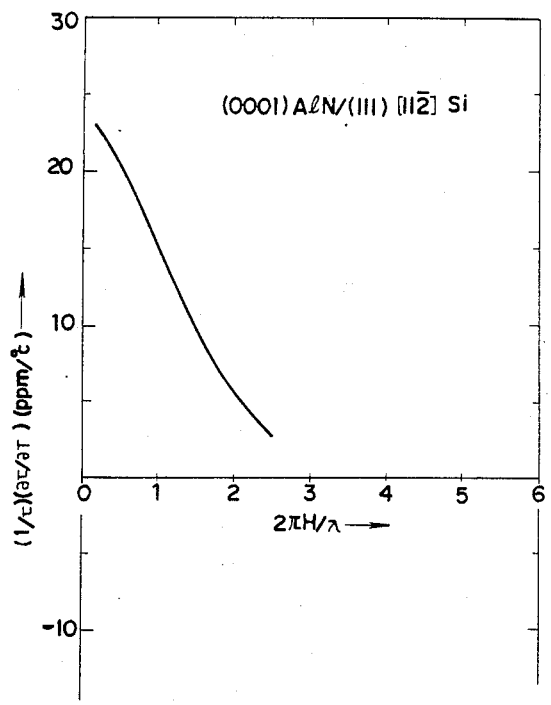
Figure 17B:
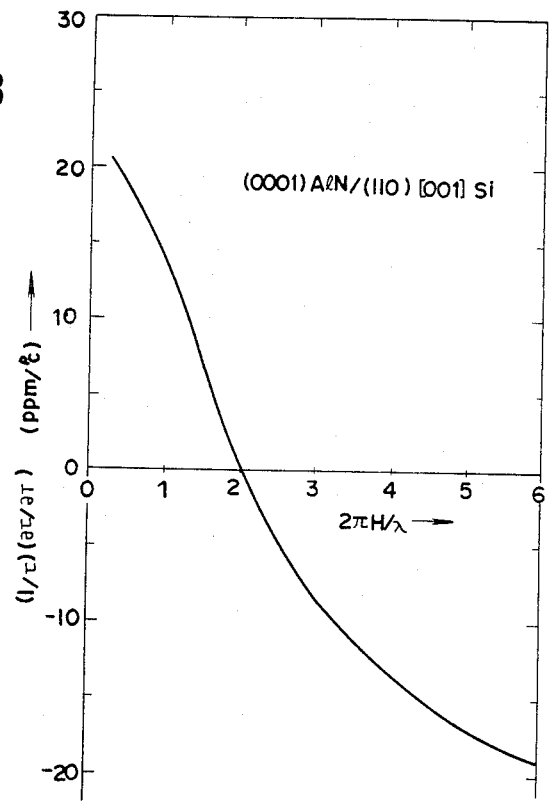
Figure 17C:
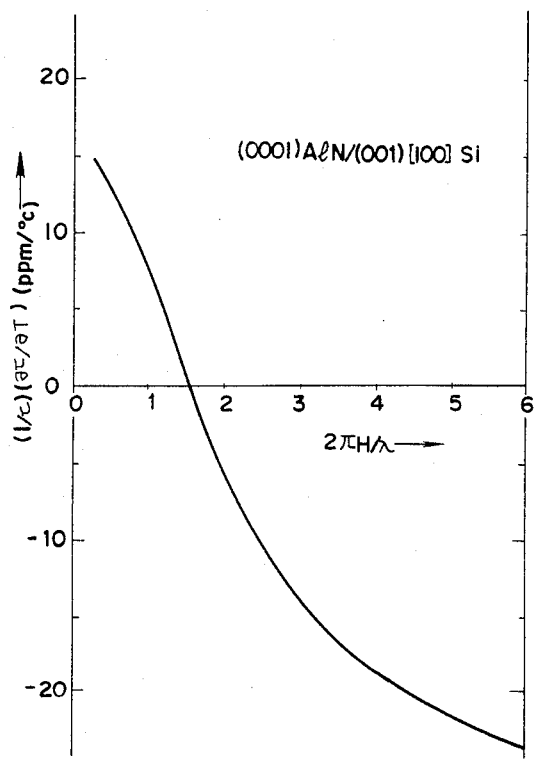
Figure 17D:
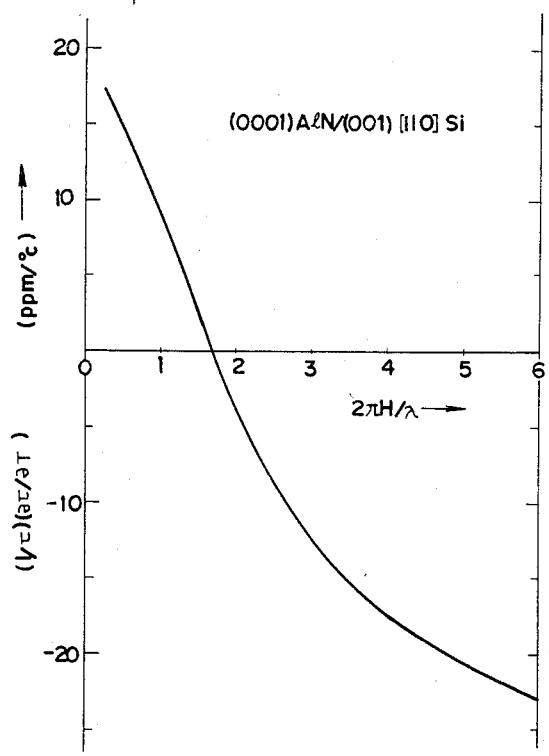

FIGS. 17A to 17D show characteristic curves of delay time temperature coefficients (TCD) which are obtained by the same embodiments. The abscissa is the normalized thickness $2\pi H/\lambda$ while the ordinate shows temperature variation ratio $(1/\tau) \cdot (\partial \tau/\partial T)$ of delay time $\tau$ of surface acoustic wave in ppm/°C. unit. The curve of FIG. 17A is obtained when surface acoustic wave progagates in the direction equivalent to the [112]-axis on the (111)-surface of the silicon single-crystal substrate 11, the curve of FIG. 17B is obtained when surface acoustic wave propagates in the direction equivalent to the [001]-axis of the (110)-surface, the curve of FIG. 17C is obtained when surface acoustic wave propagates in the direction equivalent to the [100]-axis on the (001)-surfaces, and the curve of FIG. 17D is obtained when surface acoustic wave propagates in the direction equivalent to the [110]-axis on the (001)-surface, respectively. Since the delay time temperature coefficient of the silicon single-crystal substrate 11 is positive while that of the AlN film 12 is negative, the both temperature coefficients compensate each other, and the resulting characteristic varies in accordance with the thickness H of the AlN film 12. The thickness H may be determined so that delay time temperature variation rate approaches zero.

Figure 15B:
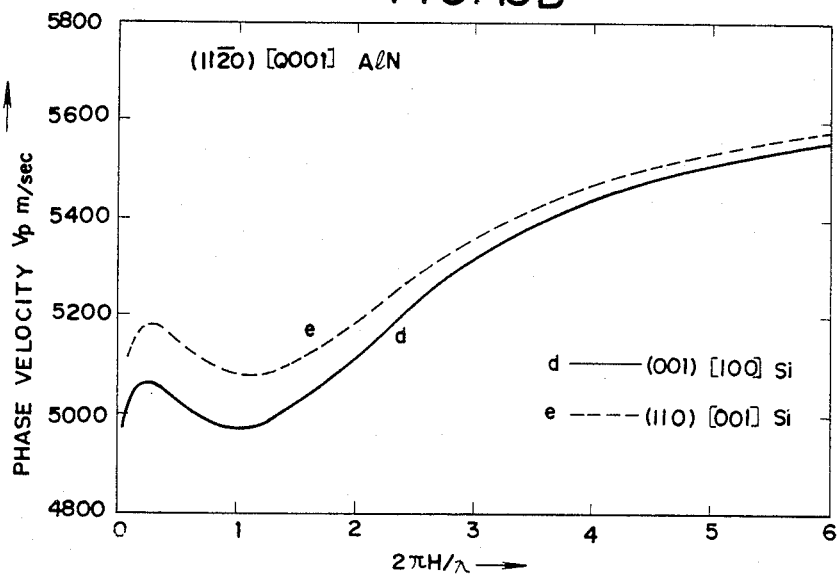

FIG. 15B shows velocity dispersion characteristics of surface acoustic wave which are obtained when surface acoustic wave propagates in the parallel direction to the piezoelectric axis (C-axis or [0001]-axis). The curve (d) is obtained when surface acoustic wave propagates in the direction equivalent to the [001]-axis on the (001)-surface of the silicon single-crystal substrate 11 while the curve (e) is obtained when surface acoustic wave propagates in the direction equivalent to the [001]-axis on the (110)-surface of the silicon single-crystal substrate 11. The phase velocity $V_p$ does not disperse so much and is very large.

Figure 16B:
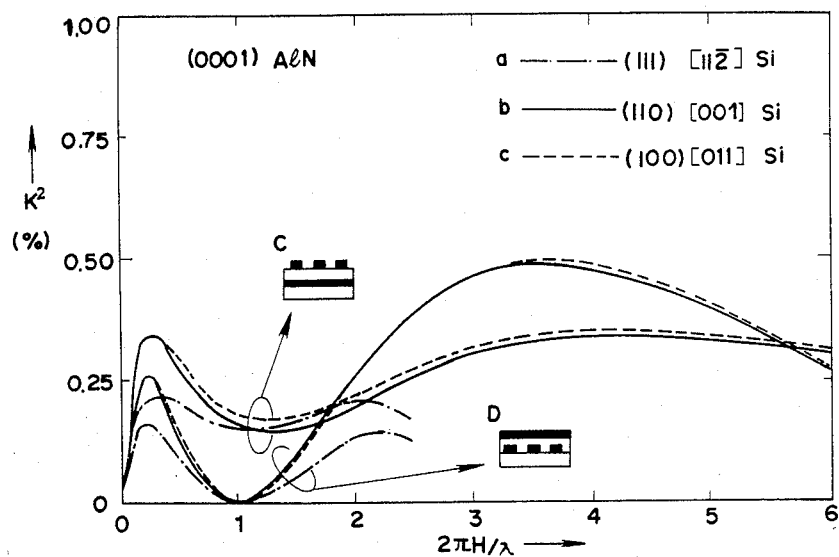
Figure 16C:
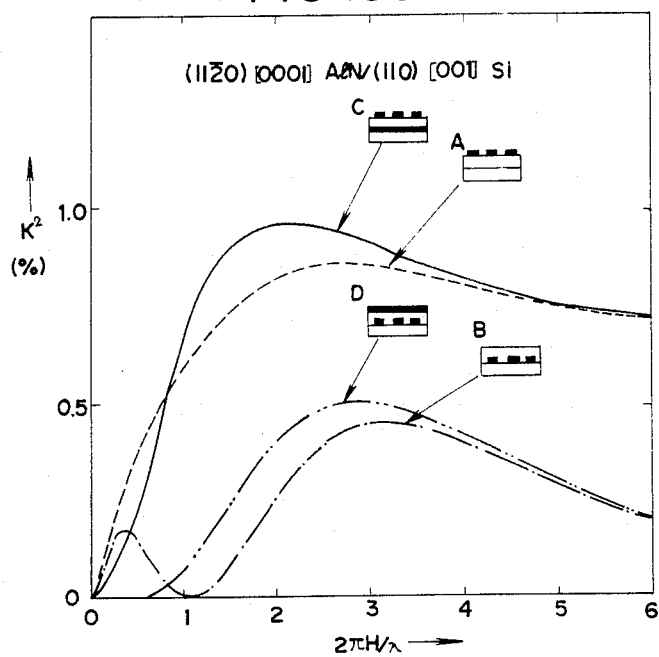
Figure 16D:
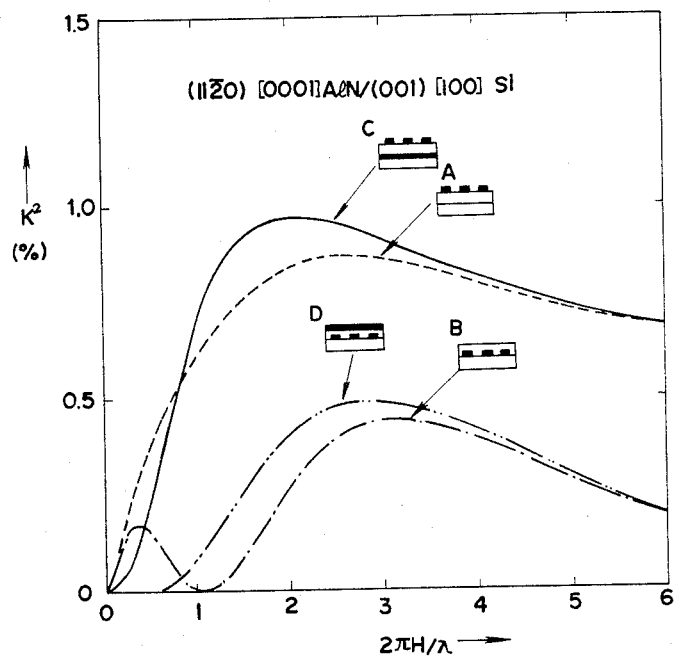

FIGS. 16C and 16D show characteristic curves of electromechanical coupling coefficient which are obtained by the same device and by the same propagating directions. Device A in the same Figures has the structure of FIG. 11. The curve of FIG. 16C is obtained when surface acoustic wave propagates in the direction equivalent to the [001]-axis on the (110)-surface of the silicon single-crystal substrate 11 while the curve of FIG. 16D is obtained when surface acoustic wave propagates in the direction equivalent to the [100]-axis on the (001)-surface of the substrate 11. These Figures show that electromechanical coupling coefficients $K^2$ suitable for generation and detection of surface acoustic wave and excellent piezoelectricities can be obtained.

Figure 17E:
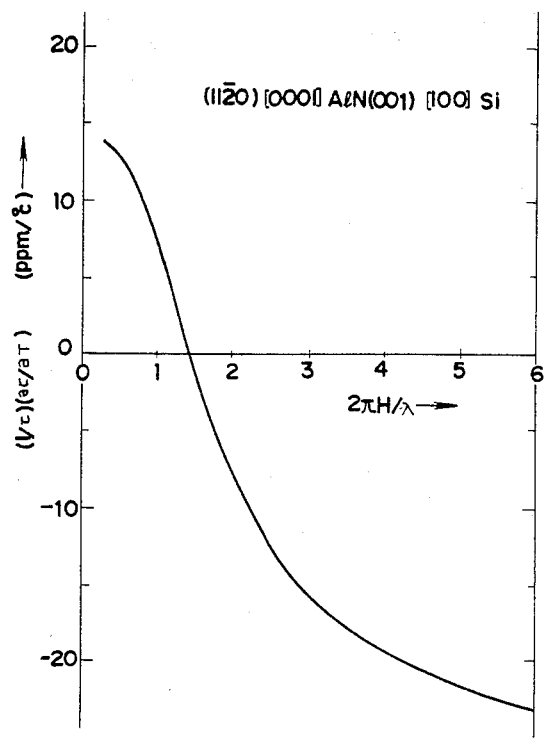
Figure 17F:
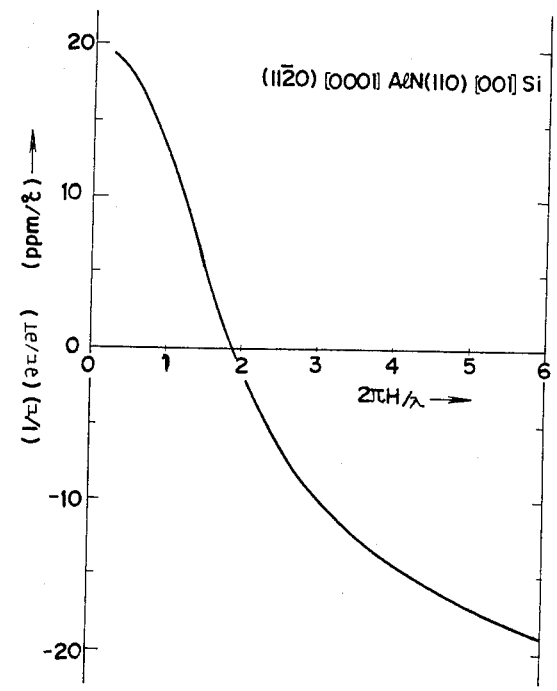

FIGS. 17E and 17F show delay time temperature coefficients (TCD) of surface acoustic wave under the same condition. The curve of FIG. 17E is obtained when surface acoustic wave propagates in the direction equivalent to the [100]-axis on the (001)-surface of the silicon single-crystal substrate 11 while the curve of FIG. 17F is obtained when surface acoustic wave propagates in the direction equivalent to the [001]-axis on the (110)-surface of the substrate 11. As understood from FIGS. 17A to 17F, when the thickness H of the AlN film 12 is in the range to satisfy the relation $0.2 < 2\pi H/\lambda < 3.0$, delay time temperature variation ratio approaches zero.

Figure 12:
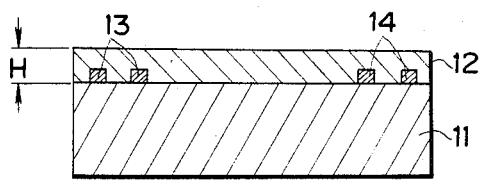

The embodiment of FIG. 12 has as a structure comprising the silicon single-crystal silicon substrate 11, the SAW generating electrodes 13 as well as the SAW detecting electrodes 14 both provided on the surface of the substrate 11, and the AlN film 12 deposited on the substrate 11 so as to cover the electrodes 13 and 14.

The embodiment of FIG. 13 has a structure comprising the silicon single-crystal substrate 11, a pair of screen electrodes 17 provided on parts of the substrate 11 to serve as second electrodes, the AlN film 12 provided on the substate 11 so as to cover the screen electrodes 17, and the SAW generating electrodes 13 as well as the SAW detecting electrodes 14 both provided on the AlN film 12.

The embodiment of FIG. 14 has a structure comprising the silicon single-crystal substrate 11, the SAW generating electrodes 13 as well as the SAW detecting electrodes 14 provided on the surface of the substrate 11 to serve as first electrodes, the AlN film 12 provided on the substrate 11 so as to cover the electrodes 13 and 14, and the pair of screen electrodes 17 provided on parts of the AlN film 12.

FIGS. 16A and 16B show $K^2$ characteristics which are obtained when the surface acoustic wave propagates in the direction perpendicular to the piezoelectric axis of the AlN film 12 by use of the surface acoustic wave devices with the structures of FIGS. 12 to 14. In these Figures, device B corresponds to FIG. 12, device C to FIG. 13 and device D to FIG. 14, respectively. These Figures show that electromechanical coefficients $K^2$ suitable for generation and detection of surface acoustic waves and excellent piezoelectricities can be obtained.

FIGS. 16C and 16D show $K^2$ characteristics which are obtained when the surface acoustic wave propagates in the direction parallel to the piezoelectric axis of the AlN film 12 by use of the devices of FIGS. 12 to 14. The curve of FIG. 16C is obtained when a surface acoustic wave propagates in the direction equivalent to the [001]-axis on the (110)-surface of the substrate 11 while the curve of FIG. 16D is obtained when a surface acoustic wave propagates in the direction equivalent to the [100]-axis on the (001)-surface of the substrate. These Figures show that electromechanical coupling coefficients $K^2$ suitable for generation and detection of surface acoustic waves and excellent piezoelectricities can be obtained.

As apparent from FIGS. 16A to 16D, when the normalized thickness $2\pi H/\lambda$ is in the range from 0.2 to 6.0, $K^2$ values suitable for practical use and excellent piezoelectricities can be obtained.

The AlN film may be an AlN single-crystal epitaxial film. In this case, the surface acoustic wave device can be made by the system as shown in FIG. 25.

Figure 25:
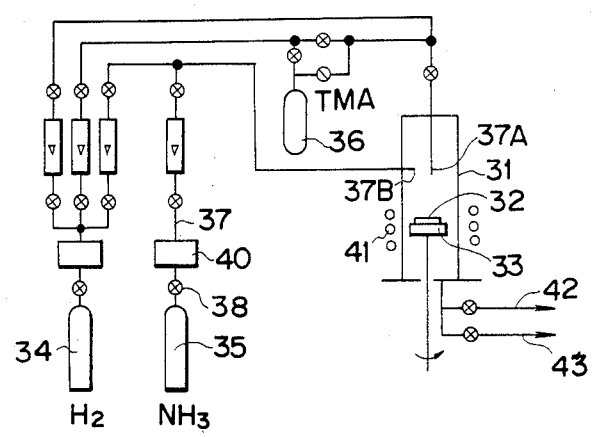
FIG. 25 is a block diagram of a MO-CVD (metal organic-chemical vapor deposition) system for epitaxial processing.

FIG. 25 is a block diagram of a MO-CVD (metal organic-chemical vapor deposition) system for epitaxial processing. Reference numeral 31 designates a standing-type reaction tube in which a silicon single-crystal substrate 32 to be processed is put on a rotatable support plate 3. Reference numeral 34 is a hydrogen ($H_2$) gas source, 35 is an ammonia ($NH_3$) gas source, 36 is a source of an alminum compound which may be trimethylaluminum (TMA, $Al(CH_3)_3$: liquid at ordinary temperature), for example, 37A and 37B are pipes, 38 is a valve, 39 is a flowmeter, 40 is a purifier, 41 is a high-frequency coil, 42 is a vacuum suction pipe, and 43 is a discharge pipe.

While rotating the silicon single-crystal substrate 32 within the stand-type reaction tube 31 by the rotatable support plate 33 and applying heat to the substrate 32 by the high-frequency coil 41, trimethylaluminum which is bubbled by hydrogen gas is supplied to the reaction tube 31 through the pipe 37A, and ammonia gas is supplied to the reaction tube 31 through the pipe 37B. Trimethylaluminum and ammonia react on each other within the reaction tube 31, resulting in formation and epitaxial growth of AlN film on the silicon single-crystal substrate 32.

Film growth velocity 3 lm/h of the AlN film was obtained under the following epitaxial processing conditions; heast applied to the silicon single-crystal substrate 32: 1,260° C.; hydrogen gas flow: 5 l/min; ammonia gas flow: 3 l/min; and trimethylaluminum flow: $13.6 \times 10^{-6}$ mol/min. Further, silicon single-crystal substrates with (111)-crystal-surface, (110)-crystal-surface and (100)-crystal surface, respectively, are used and are processed in the same manner. As the result, in each case, the AlN film grew into (0001)-crystal-surface.

The substrate of materials other than silicon single-crystal may be used to provide the AlN film thereon provided delay time temperature coefficient is negative. For example, the substrate may comprise a silicon single-crystal plate and a silicon surface protection film of silicon dioxide deposited on the silicon single-crystal plate.

FIGS. 18 to 21 show still further embodiments according to the present invention wherein an SOS (silicon-on-sapphire) substrate is used as the elastic substrate with positive delay time temperature coefficient to surface acoustic waves.

Figure 18:
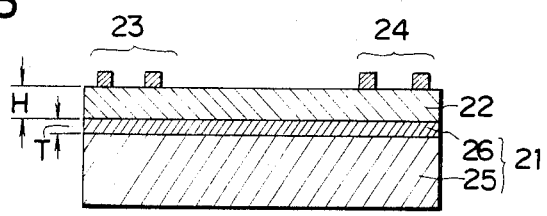
FIGS. 18 to 21 are sectional views illustrating still further embodiments according to the present invention.

In FIG. 18, reference numeral 21 designates an SOS substrate which comprises a sapphire substrate 25 and a silicon film 26 deposited on the sapphire substrate 25.

Reference numeral 22 denotes an AlN film which is deposited on the SOS substrate 21 so that the piezoelectric axis (C-axis or [0001]-axis) of the film is perpendicular or parallel to the surface of the SOS substrate 21. Reference numerals 23 and 24 are comb-shaped electrodes for generation of surface acoustic waves and comb-shaped electrodes for detection of surface acoustic waves, both provided on the surface of the AlN film 22. H is thickness of the AlN film 22, and T is thickness of the silicon film 26.

Figure 22A:
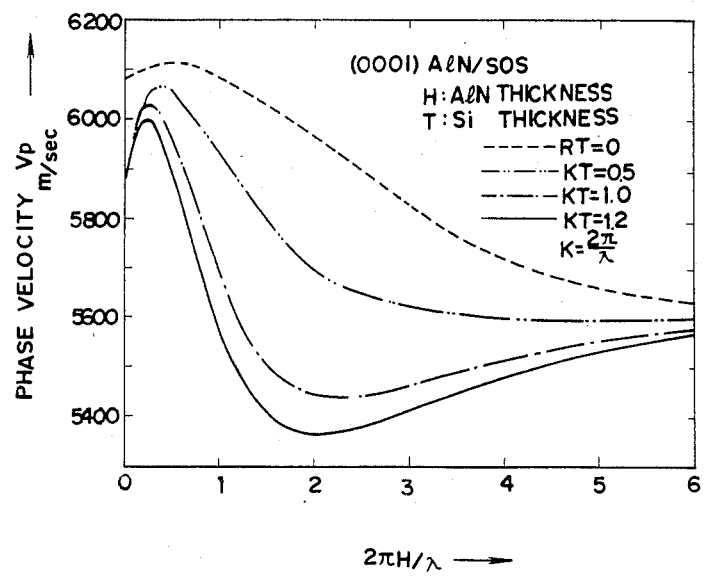

FIG. 22A shows a velocity dispersion characteristic to surface acoustic wave which is obtained when using the device of FIG. 18 and having surface acoustic wave propagate in the direction perpendicular to the piezoelectric axis(C-axis or [0001]-axis) of the AlN film 22. The abscissa is normalized thickness $2\pi H/\lambda$ while the ordinate is phase velocity $V_p$ of the surface acoustic wve. As is apparent from this Figure, the phase velocity $V_p$ does not disperse so much and is very large.

FIG. 23A shows a characteristic curve of electromechanical coefficient which is obtained under the same condition. The abscissa is normalized thickness $2\pi H/\lambda$ while the ordinate is electromechanical coupling coefficient $K^2$. Device A corresponds to the structure of FIG. 18. When the normalized thickness $2\pi H/\lambda$ is near 3.0, the value of $K^2$ is 0.39% approximately. This value is suitable for generation and detection of surface acoustic waves.

Figure 24A:
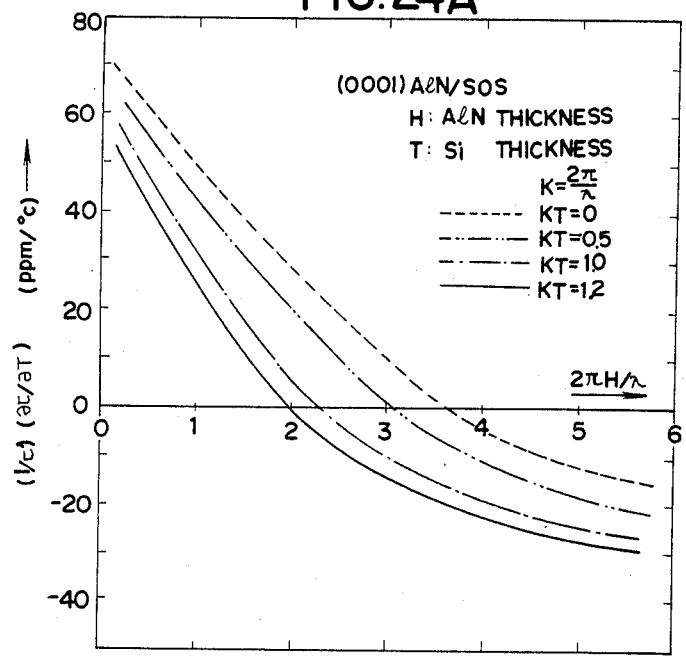

FIG. 24A shows a characteristic curve of delay time temperature coefficient (TCD) to surface acoustic waves which is obtained under the same condition. The abscissa is normalized thickness $2\pi H/\lambda$ while the ordinate shows temperature variation ratio $(1/\pi)\cdot(\partial\tau/\partial T)$ of delay time $\tau$ of surface acoustic waves in ppm/°C. unit. Since the delay time temperature coefficient of the SOS substrate 21 is positive while that of the AlN film 22 is negative, the both temperature coefficients compensate each other and the resulting characteristic varies in accordance with the thickness H of the AlN film 22. When the thickness H is determined to satisfy the relation $1.0 < 2\pi H/\lambda < 4.0$, delay time temperature variation ratio approaches zero.

Figure 22B:
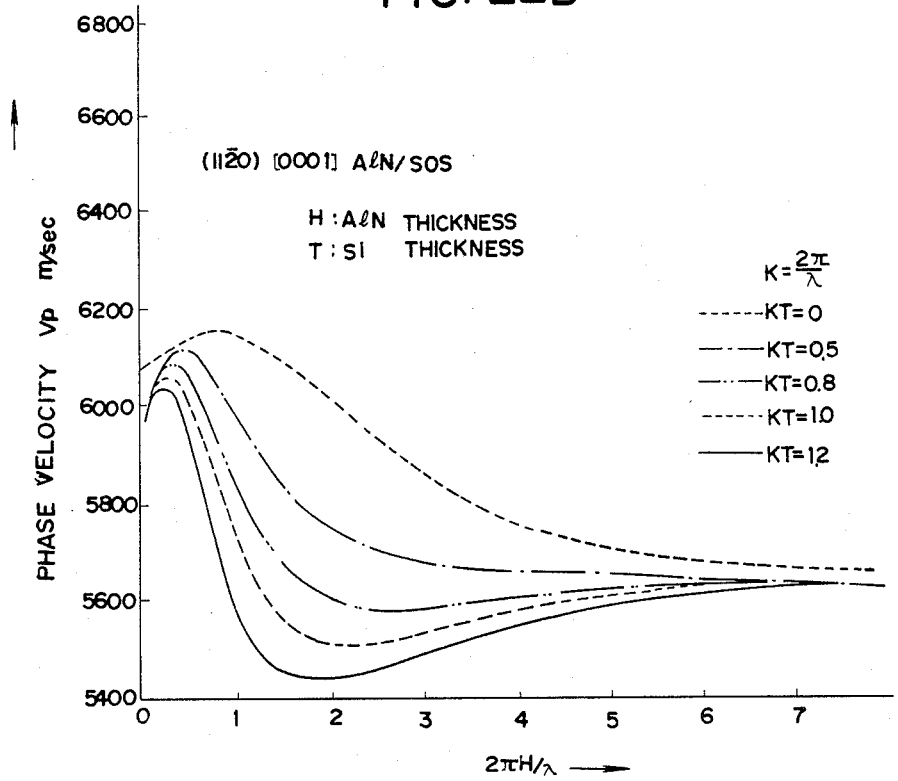

FIG. 22B shows a velocity dispersion characteristic of surface acoustic waves which is obtained when using the device of FIG. 18 and having surface acoustic waves propagate in the direction parallel to the piezoelectric axis (C-axis or [0001-axis) of the AlN film 22. As apparent from this Figure, the phase velocity $V_p$ does not disperse so much and is very large.

FIG. 23B shows a characteristic curve of electromechanical coupling coefficient which is obtained under the same condition. The curve A is the characteristic corresponding to the structure of FIG. 18. When the normalized thickness $2\pi H/\lambda$ is near 2.9, $K^2$ is 0.88% approximately. This value is suitable for generation and detection of surface acoustic waves.

Figure 24B:
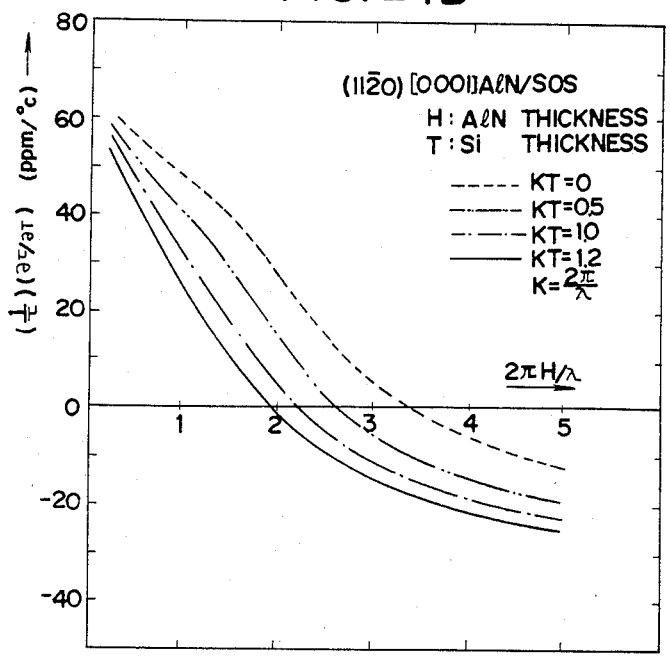

FIG. 24B shows a characteristic curve of delay time temperature coefficient (TCD) to surface acoustic waves which is obtained by the same condition. When the thickness H of the AlN film 22 is determined to satisfy the relation $1.0 < 2\pi H/\lambda < 4.0$, temperature variation ratio of delay time approaches zero.

Figure 19:
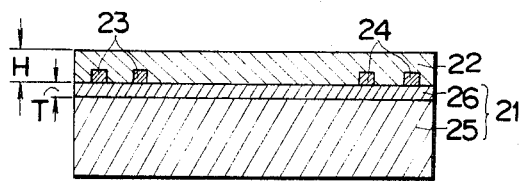

The embodiment of FIG. 19 has a structure wherein the SAW generating electrodes 23 and the SAW detecting electrodes 24 are provided on the surface of the SOS substrate 21 and the AlN film 22 is thereafter deposited on the SOS substrate 21 so as to cover the electrodes 23 and 24.

Figure 20:
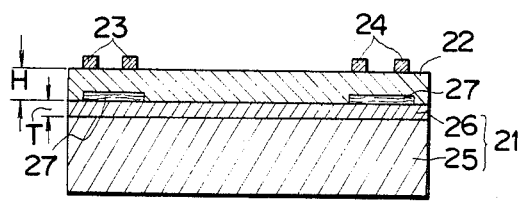

In the embodiment of FIG. 20, a pair of screen electrodes 27 to serve as second electrodes are provided on parts of the surface of the SOS substrate 21, the AlN film 22 is thereafter provided on the substrate 21 so as to cover the screen electrodes, and the SAW generating electrodes 23 as well as the SAW detecting electrodes 24 both to serve as first electrodes are provided on the AlN film 22.

Figure 21:
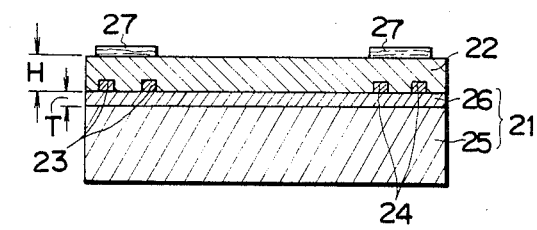

In the embodiment of FIG. 21, the SAW generating electrodes 23 and the SAW detecting electrodes 24 to serve as first electrodes are provided on the surface of the SOS substrate 21. The AlN film 22 is thereafter deposited on the substrate 21 so as to cover the electrodes 23 and 24. The pair of screen electrodes 27 to serve as first electrodes are provided on the surface of the AlN film 22.

When the devices of FIGS. 19 to 21 are used and the surface acoustic wave propagates in the direction perpendicular to the piezoelectric axis of the AlN film 22, velocity dispersion characteristics of surface acoustic waves are substantially the same as that of FIG. 22A, and delay time temperature coefficients (TCD) to surface acoustic waves are substantially the same as that of FIG, 24A. Further, $K^2$ characteristics are shown in FIG. 23A in which device B corresponds to the structure of FIG. 19, device C to FIG. 20, and device D to FIG. 21, respectively. In case of device B, when the normalized thickness $2\pi H/\lambda$ is near 3.1, $K^2$ represents double peak characteristic of 0.35%. In case of device D, when the normalized thickness $2\pi H/\lambda$ is 0.27 and 3.6, $K^2$ reaches two peaks of 0.27% and 0.45%, respectively. These values are suitable for generation and detection of surface acoustic waves.

When the devices of FIGS. 19 to 21 are used and the surface acoustic wave propagates in the direction parallel to the piezoelectric axis of the AlN film 22, velocity dispersion characteristics are substantially same as that of FIG. 22B, and delay time temperature coefficients (TCD) to surface acoustic wave are substantially same as that of FIG. 24B. $K^2$ characteristics which are obtained under the same conditions are shown in FIG. 23B wherein device B corresponds to the structure of FIG. 19, device C to FIG. 20 and device D to FIG. 21, respectively. In case of device B, when the normalized thickness $2\pi H/\lambda$ is 0.4 and 2.9, $K^2$ reaches the peaks 0.15% and 0.62%, respectively. In case of device C, then the normalized thickness $2\pi H/\lambda$ is near 1.9, $K^2$ is 0.97%, and in case of D, when the normalized thickness $2\pi H/\lambda$ is near 2.8, $K^2$ is 0.7%. These values are suitable for generation and detection of surface acoustic waves.

As shown in FIGS. 23A and 23B, by selecting normalized thickness $2\pi H/\lambda$ of 0.1 to 6.0, it is possible to obtain $K^2$ values suitable for practical use and excellent piezoelectricities.

The SOS substrate for deposition of the AlN film thereon may be replaced by other desired materials having negative delay time temperature coefficients.

Since the AlN film has a large energy gap of 6.2 eV and may easily be designed to have a specific resistance larger than $10^{16} \Omega cm$, it is excellent in insulation.

Further, the AlN film is superior to zinc oxide film which is made by sputtering, because film with even and constant quality can be obtained. This makes it possible to keep propagation loss small, even in high frequency band.

Particularly because delay time temperature coefficient to surface acoustic waves of the AlN film is negative, when it is deposited on a substrate such as a sapphire substrate whose delay time temperature coefficient is in turn positive, the both temperature coefficients compensate each other, and the resulting characteristic is stable to variation of temperature. Stability of surface acoustic wave devices against temperature variation is the most important factor in a narrow band signal processing device such as resonator, oscillator, etc. From this point of view, each of the above-mentioned devices ensures stable action against temperature variation. Suitability to the high frequency band and low propagation loss are also assured by the same devices.

As described in the above, the present invention, in which an elastic structure is used by depositing an AlN film on an elastic substrate whose delay time temperature coefficient to surface acoustic waves is positive, realizes a surface acoustic wave device which is exceptional in various characteristics.

The main effects of the present invention is as follows:

1. due to high velocity of the surface acoustic wave, wavelength in the high frequency band is large, thereby facilitating fabrication of comb-shaped electrodes;

2. due to small frequency variation ratio depending on variation of film thickness, it is easy to fabricate devices suitable for the desired frequency band, resulting in good yield and cost reduction;

3. it is possible to keep the delay time of the surface acoustic wave device near zero; and 4. AlN film with good insulation can be easily made. Further, AlN single-crystal epitaxial film is easily provided by the MO-CVD method.

Crystal orientations of the substrate and the AlN film and also propagation direction of the surface acoustic wave are not restricted to those of the described embodiment. Other orientations and directions can give similar results.

We claim:

1. In a surface acoustic wave device comprising an elastic substrate, an aluminum nitride (AlN) layer deposited on said elastic substrate, and electrodes provided on said AlN layer for converting an electric signal to a surface acoustic wave and vice versa, respectively, said elastic substrate having the property that its temperature coefficient of delay to the surface acoustic wave is positive, and said aluminum nitride layer having an orientation of the piezoelectric axis thereof so that its temperature coefficient of delay to the surface acoustic wave is negative.

2. Surface acoustic wave device as set forth in claim 1 wherein said elastic substrate is made of sapphire.

3. Surface acoustic wave device as set forth in claim 2 wherein said sapphire substrate has a major surface equivalent to (0001)-crystal-surface, said piezoelectric axis of the AlN layer being perpendicular to said major surface of the sapphire substrate, and said electrodes having surface acoustic wave propagation in a direction equivalent to [1100]-axis on said major surface of the sapphire substrate.

4. Surface acoustic wave device as set forth in claim 2 wherein said sapphire substrate has a major surface equivalent to (0001)-crystal-surface, said piezoelectric axis of the AlN layer being parallel to said major surface of the sapphire substrate, and said electrodes having surface acoustic wave propagation in a direction equivalent to [1100]-axis on said major surface of the sapphire substrate.

5. Surface acoustic wave device as set forth in claim 3 or 4 wherein thickness H of said AlN layer is in the range to satisfy the relation $2 < 2\pi H/\lambda < 6$ ($\lambda$ is wavelength of surface acoustic wave).

6. Surface acoustic wave device as set forth in claim 2 wherein said sapphire substrate has a major surface equivalent to (0001)-crystal-surface, said piezoelectric axis of the AlN layer being perpendicular to said major surface of the sapphire substrate, and said electrodes having surface acoustic wave propagation in the direction equivalent to [1120]-axis on said major surface of the sapphire substrate.

7. Surface acoustic wave device as set forth in claim 2 wherein said sapphire substrate has a major surface equivalent to (0001)-crystal-surface, said piezoelectric axis of the AlN layer being parallel to said major surface of the sapphire substrate, and said electrodes having surface acoustic wave propagation in the direction equivalent to [1120]-axis on said major surface of the sapphire substrate.

8. Surface acoustic wave device as set forth in claim 6 or 7 wherein thickness H of said AlN layer is in the range to satisfy the relation $2 < 2\pi H/\lambda < 8$.

9. Surface acoustic wave device as set forth in claim 1 wherein said AlN layer is single-crystal epitaxial AlN layer.

10. A surface acoustic wave device as set forth in claim 1 wherein said elastic substrate substantially consists of single crystal silicon.

11. In a surface acoustic wave device comprising an elastic substrate, an aluminum nitride (AlN) layer deposited on said elastic substrate, and electrodes provided between said elastic substrate and said AlN layer for converting an electric signal to a surface acoustic wave and vice versa, respectively, an improvement comprising: said elastic substrate having the property that its temperature coefficient of delay to the surface acoustic wave is positive, and said aluminum nitride layer having an orientation of the piezoelectric axis thereof so that its temperature coefficient of delay to the surface acoustic wave is negative.

12. Surface acoustic wave device as set forth in claim 10 wherein screen electrodes are provided at positions between said substrate and said AlN layer corresponding to positions of said surface acoustic wave electrodes.

13. Surface acoustic wave device as set forth in claim 11 wherein screen electrodes are provided at positions on said AlN layer corresponding to positions of said surface acoustic wave electrodes.

14. Surface acoustic wave device as set forth in claim 10 or 11, wherein said elastic substrate is made of single crystal silicon.

15. Surface acoustic wave device as set forth in claim 2 wherein said sapphire substrate has a major surface equivalent to (0112)-crystal-surface, said piezoelectric axis of the AlN layer being perpendicular to said major surface of the sapphire substrate, and said electrodes having surface acoustic wave propagation in the direction equivalent to [0111]-axis on said major surface of the sapphire substrate.

16. Surface acoustic wave device as set forth in claim 2 wherein said sapphire substrate has a major surface equivalent to (0112)-crystal-surface, said piezoelectric axis of the AlN layer being parallel to said major surface of the sapphire substrate, and said electrodes having surface acoustic wave propagation in the direction equivalent to [0111]-axis on said major surface of the sapphire substrate.

17. Surface acoustic wave device as set forth in claim 15 or 16 wherein thickness H of said AlN layer is in the range to satisfy the relation $1<2\pi H/\lambda<8$.

18. Surface acoustic wave device as set forth in claim 14 wherein said single crystal silicon substrate has a major surface equivalent to [111)-crystal-surface, said piezoelectric axis of the AlN layer being perpendicular to said surface of the single crystal silicon substrate, and said surface acoustic wave electrodes having surface acoustic wave propagation in a direction which is perpendicular to said piezoelectric axis of the AlN layer.

19. Surface acoustic wave device as set forth in claim 18 wherein thickness H of said AlN layer is in the range to satisfy the relation $0.2<2\pi H/\lambda<2.5$.

20. Surface acoustic wave device as set forth in claim 14 wherein said single crystal silicon substrate has a major surface equivalent to (111)-crystal-surface, said piezoelectric axis of the AlN layer being parallel to said surface of the single crystal silicon substrate, and said surface acoustic wave electrodes having surface acoustic wave propagation in a direction which is perpendicular to said piezoelectric axis of the AlN layer.

21. Surface acoustic wave device as set forth in claim 10 or 11, wherein said AlN layer is single-crystal epitaxial film.

22. A surface acoustic wave device as set forth in claim 1 wherein said elastic substrate is an SOS substrate consisting of a sapphire substrate and a silicon film provided on said sapphire substrate.

23. A surface acoustic wave device as set forth in claim 11 wherein said elastic substrate is an SOS (silicon-on-sapphire) substrate consisting of a sapphire substrate and a silicon film deposited on said sapphire substrate.

24. Surface acoustic wave device as set forth in claim 22 wherein screen electrodes are provided at positions on said SOS substrate corresponding to positions of said surface acoustic wave electrodes.

25. Surface acoustic wave device as set forth in claim 23 wherein screen electrodes are provided at positions between said SOS substrate and said AlN layer corresponding to positions of said surface acoustic wave electrodes.

26. Surface acoustic wave device as set forth in claim 22 or 23, wherein said piezoelectric axis of the AlN layer is perpendicular to a major surface of said SOS substrate.

27. Surface acoustic wave device as set forth in claim 22 or 23, wherein said piezoelectric axis of the AlN layer is parallel to a major surface of said SOS substrate.

28. Surface acoustic wave device as set forth in claim 20 wherein thickness H of said AlN layer is in the range to satisfy the relation $0.2<2\pi H/\lambda<2.5$.

29. Surface acoustic wave device as set forth in claim 14 wherein said single crystal silicon substrate has a major surface equivalent to (111)-crystal-surface, said piezoelectric axis of the AlN layer being parallel to said surface of the single crystal silicon substrate, and said surface acoustic wave electrodes having surface acoustic wave propagation in a direction which is parallel to said piezoelectric axis of the AlN layer.

30. Surface acoustic wave device as set forth in claim 29 wherein thickness H of said AlN layer is in the range to satisfy the relation $0.2<2\pi H/\lambda<2.5$.

31. Surface acoustic wave device as set forth in claim 14 wherein said single crystal silicon substrate has a major surface equivalent to (110)-crystal-surface, said piezoelectric axis of the AlN layer being perpendicular to said major surface of the substrate, and said surface acoustic wave electrodes having surface acoustic wave propagation in a direction which is perpendicular to said piezoelectric axis of the AlN layer.

32. Surface acoustic wave device as set forth in claim 31 wherein thickness H of said AlN layer is in the range to satisfy the relation $1<2\pi H/\lambda<3$.

33. Surface acoustic wave device as set forth in claim 14 wherein said single crystal silicon substrate has a major surface equivalent to (110)-crystal-surface, said piezoelectric axis of the AlN layer being parallel to said major surface of the substrate, and said surface acoustic wave electrodes having surface acoustic wave propagation in a direction which is perpendicular to said piezoelectric axis of the AlN layer.

34. Surface acoustic wave device as set forth in claim 33 wherein thickness H of said AlN layer is in the range to satisfy the relation $1<2\pi H/\lambda<3$.

35. Surface acoustic wave device as set forth in claim 14 wherein said single crystal silicon substrate has a major surface equivalent to (110)-crystal-surface, said piezoelectric axis of the AlN layer being parallel to said major surface of the substrate, and said surface acoustic wave electrodes having surface acoustic wave propagation in a direction which is parallel to said piezoelectric axis of the AlN layer.

36. Surface acoustic wave device as set forth in claim 35 wherein thickness H of said AlN layer is in the range to satisfy the relation $1<2\pi H/\lambda<3$.

37. Surface acoustic wave device as set forth in claim 14 wherein said single crystal silicon substrate has a major surface equivalent to (001)-crystal-surface, said piezoelectric axis of the AlN layer being perpendicular to said major surface of the substrate, and said surface acoustic wave electrodes having surface acoustic wave propagation in a direction which is perpendicular to said piezoelectric axis of the AlN layer.

38. Surface acoustic wave device as set forth in claim 37 wherein thickness H of said AlN layer is in the range to satisfy the relation $1<2\pi H/\lambda<2$.

39. Surface acoustic wave device as set forth in claim 14 wherein said single crystal silicon substrate has a major surface equivalent to (001)-crystal-surface, said piezoelectric axis of the AlN layer being parallel to said major surface of the substrate, and said surface acoustic wave electrodes having surface acoustic wave propagation in a direction which is perpendicular to said piezoelectric axis of the AlN layer.

40. Surface acoustic wave device as set forth in claim 39 wherein thickness H of said AlN layer is in the range to satisfy the relation $1<2\pi H/\lambda<2$.

41. Surface acoustic wave device as set forth in claim 14 wherein said single crystal silicon substrate has a major surface equivalent to (001)-crystal-surface, said piezoelectric axis of the AlN layer being parallel to said major surface of the substrate, and said surface acoustic wave electrodes having surface acoustic wave propagation in a direction which is parallel to said piezoelectric axis of the AlN layer.

42. Surface acoustic wave device as set forth in claim 41 wherein thickness H of said AlN layer is in the range to satisfy the relation $1<2\pi H/\lambda<2$.

43. Surface acoustic wave device as set forth in claim 26 wherein surface acoustic wave propagation is in a direction which is perpendicular to said piezoelectric axis of the AlN layer.

44. Surface acoustic wave device as set forth in claim 27 wherein surface acoustic wave propagation is in a direction which is perpendicular to said piezoelectric axis of the AlN layer.

45. Surface acoustic wave device as set forth in claim 27 wherein surface acoustic wave propagation is in a direction which is parallel to said piezoelectric axis of the AlN layer.

\* \* \* \* \*